United States Patent

Wen

[11] Patent Number: 5,956,585
[45] Date of Patent: Sep. 21, 1999

[54] METHOD OF FORMING A SELF-ALIGNED DAMAGE-FREE BURIED CONTACT

[75] Inventor: Wen-Ying Wen, Hsinchu, Taiwan

[73] Assignee: Winbond Electronics Corporation, Taiwan

[21] Appl. No.: 08/803,035

[22] Filed: Feb. 19, 1997

[51] Int. Cl.[6] .................. H01L 21/8234; H01L 21/8244; H01L 21/4763; H01L 21/44
[52] U.S. Cl. .......................... 438/238; 438/641; 438/682
[58] Field of Search ..................... 438/238, 682, 438/641; 148/DIG. 19, DIG. 20; 257/903, 904

[56] References Cited

U.S. PATENT DOCUMENTS 5,162,259  11/1992  Kolar et al. .......................... 437/192
5,652,160  7/1997   Lin et al. ............................ 437/41 SM
5,672,901  9/1997   Abernathey et al. ................... 257/413

Primary Examiner—Brian Dutton
Attorney, Agent, or Firm—Fulbright & Jaworski L.L.P.

[57] ABSTRACT

A method of manufacturing a semiconductor cell comprises a step of anisotropically dry etching a polysilicon layer to form a polysilicon gate wherein an etching stop is formed on a buried contact region before the anisotropically dry etching step, the etching stop is preferably formed by salicide technology of titanium silicide.

9 Claims, 5 Drawing Sheets

5,956,585

METHOD OF FORMING A SELF-ALIGNED DAMAGE-FREE BURIED CONTACT

FIELD OF INVENTION

The invention relates to a method forming a damage free self-aligned buried contact.

BACKGROUND OF INVENTION

Buried contact regions within semiconductor integrated circuits have been extensively used for connecting polysilicon elements to silicon substrate elements where needed. The following U.S. Patents discuss buried contact regions.

1. U.S. Pat. No. 5,064,776, by Roberts, "Method of Forming Buried Contact Between Polysilicon Gate and Diffusion Area".
2. U.S. Pat. No. 5,126,285, by Kosa et al., "Method for Forming a Buried Contact".
3. U.S. Pat. No. 5,348,896, by Lee, "Buried Contact Process".
4. U.S. Pat. No. 5,162,259, by Kolar et al., "Method for Forming a Buried Contact in a Semiconductor Device ,".

With reference to FIG. 1 through FIG. 4, a conventional process forming a buried contact of a CMOS SRAM cell is depicted as follows.

1. Forming an active area by forming a $SiO_2$ layer and $Si_3N_4$ layer thereafter on the substrate.
2. P-well and N-well are formed on surface of the substrate.
3. Field Oxide (FOX) is formed for isolation purpose by a conventional LOCOS process.
4. The threshold voltage (Vt) adjustment process is performed by implanting ions on the active area.
5. Gate oxide is grown on the active area.
6. Substantially 500 A thickness of thin polysilicon deposition is performed.

The resulting structure of the above processes is shown in FIG. 1 and further undergone the following processes.

7. The buried contact region is patterned by photolithography.
8. The thin polysilicon layer and gate oxide unprotected by the photoresist are dry and wet etched away to form a buried contact.
9. The photoresist is removed.

The resulting structure of the above three processes is shown in FIG. 2 and further undergone the following processes.

10. A thick polysilicon layer is then deposited.
11. Using a diffusion process, the polysilicon layer is doped with phosphorous oxychloride ($POCl_3$) to reduce its resistance. Meanwhile, phosphorous doping penetrates the interface between polysilicon and silicon to form a junction at the buried contact.
12. Polysilicon or polycide (Tungsten silicide) gate is patterned and the unprotected area is removed by anisotropically dry etch to form the gate.
13. The photoresist is removed.

The resulting structure of the above four processes is shown in FIG. 3 and undergoes further conventional processes. The formation of the trench shown in FIG. 3 is caused by misalignment between the buried contact and the polysilicon gate, and similarly in etching selectivity of the polysilicon and silicon substrate. The further conventional processes include forming a Source/Drain region, a TEOS (Tetra-Ethyl-Ortho-Silicate) SiO2 layer, poly2, a Borophosphosilicate Glass (BPSG) dielectric layer, contact (Tungsten plug), a metal layer and passivation layer. The final resulting structure is shown in FIG. 4. In FIG. 4, an undesired trench is formed around the buried contact.

It is found that cell the shown in FIG. 4, which is the result of the conventional approach, fails sometimes due to open and junction leakage caused by the trench between the N+ junction and junction of buried contact.

As the technology goes to the deep sub-micron era, the thermal budget is reduced and the $POCL_3$ concentration is decreased because of a thinner gate oxide. The opening (trench) between the N+ junction and buried contact junction and leakage of the buried contact become worse.

Therefore, it is a main object of the invention to provide a method of forming a self-aligned buried contact without trench, which overcome the drawbacks of the conventional approaches.

SUMMARY OF INVENTION

The method of manufacturing a semiconductor cell with at least one buried contact provided includes a step of anisotropically dry etching a polysilicon layer to form a polysilicon gate.

The method is characterized in that an etching stop is formed on the buried contact before the anisotropically dry etching step.

In a preferred embodiment, the etching stop is titanium silicide formed by salicide technology.

BRIEF DESCRIPTION OF THE APPENDED DRAWINGS

DETAILED DESCRIPTION OF THE INVENTION

Figure 1:
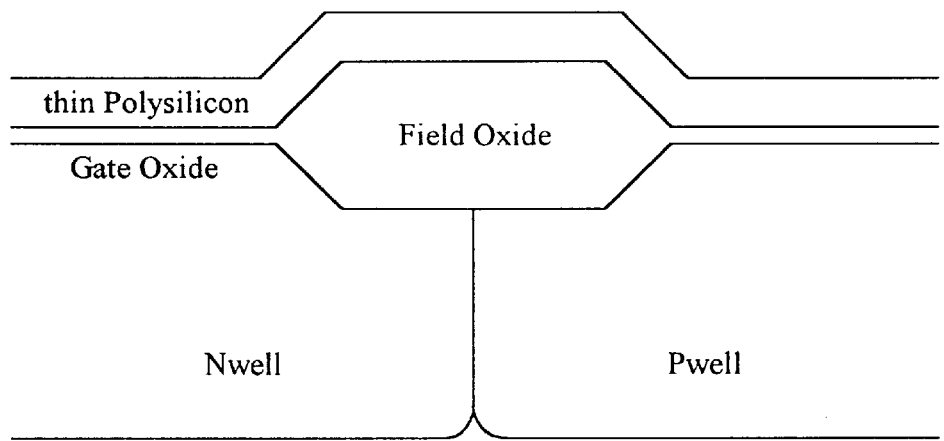
FIG. 1 through FIG. 4 illustrate the resulting semiconductor cell at successive stages in accordance with the conventional approach.
Figure 2:
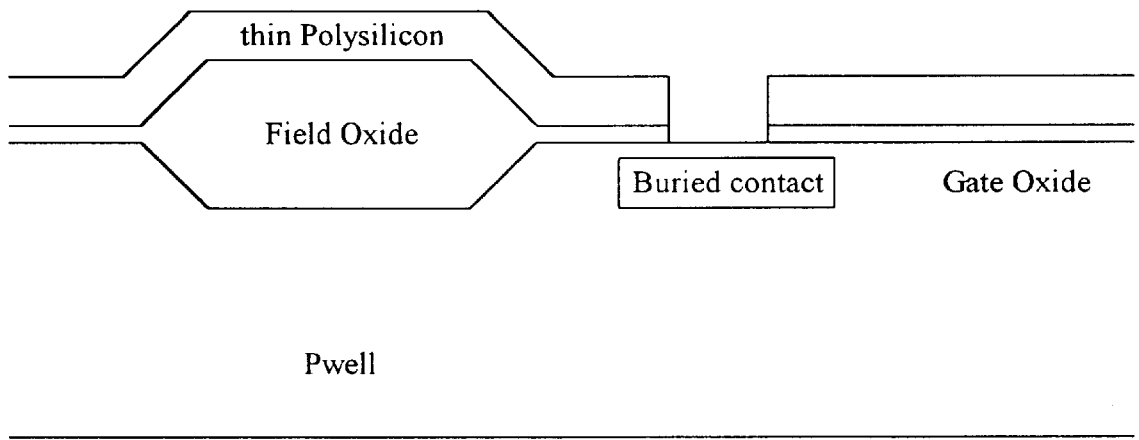
Figure 3:
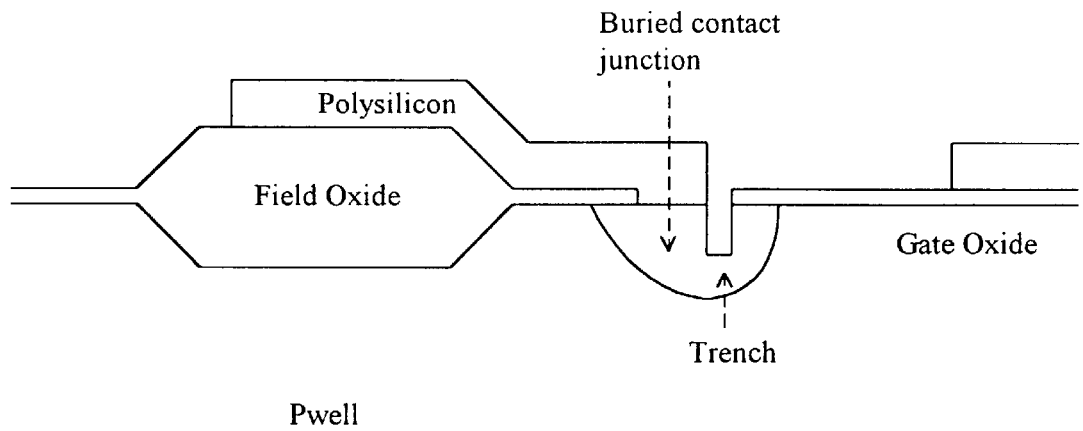
Figure 4:
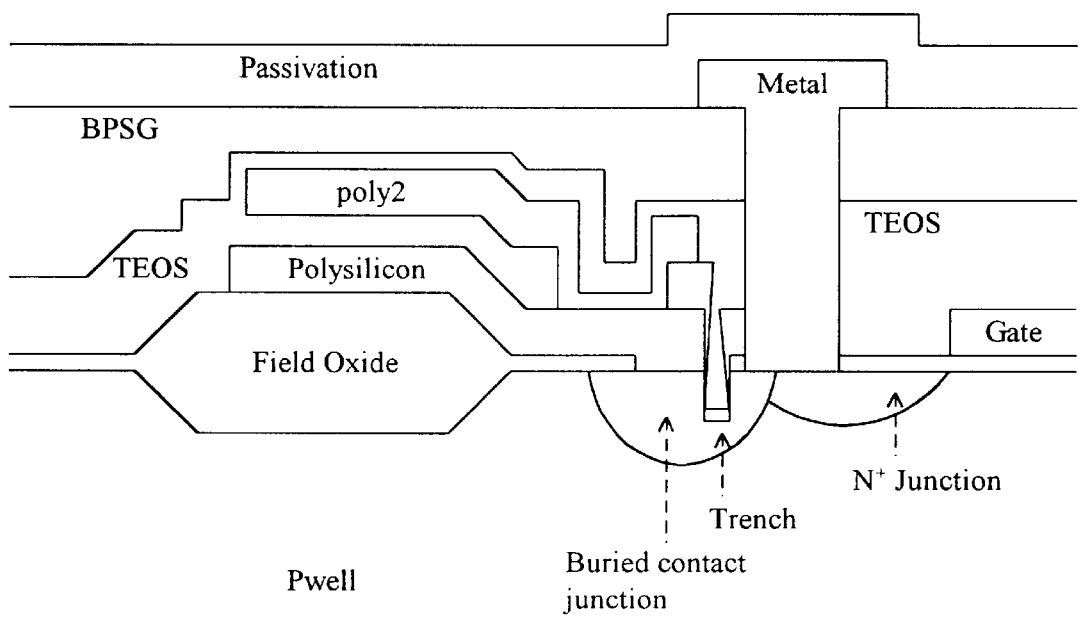
Figure 5:
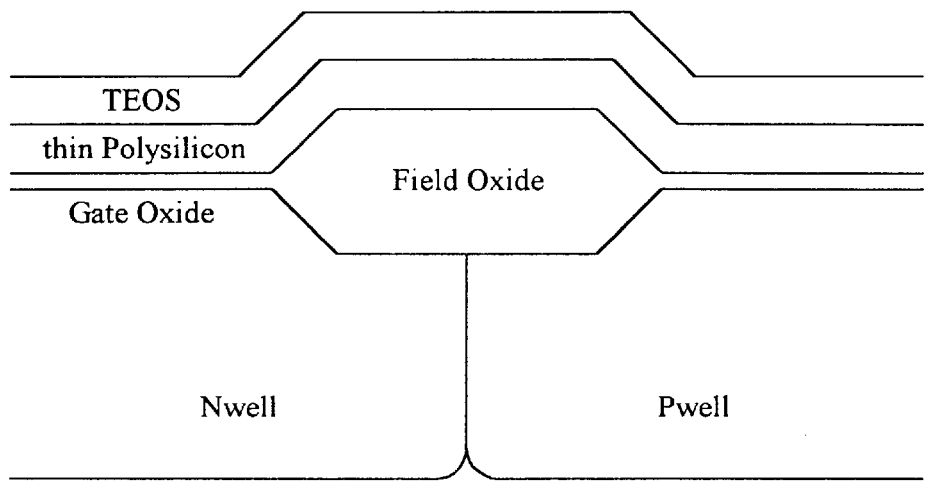
FIG. 5 through FIG. 9 illustrate the resulting semiconductor cell at successive stages in accordance with the invention.

Starting from the semiconductor cell shown in FIG. 1 by conventional steps, the invention forms a substantially 500 A (Angstrom) layer of TEOS $SiO_2$ on the thin polysilicon layer (step 1) as shown in FIG. 5.

The following steps are then performed.

2. The buried contact region is patterned by photolithography.
3. The TEOS $SiO_2$, thin polysilicon layer unprotected by the photoresist are in situ etched away by anisotropically dry itching. The thin gate oxide above the buried contact region is etched away by a wet dip in HF-based solution.
4. High dose phosphoric ions are implanted into the window of the buried contact to a form buried contact junction.
5. The photoresist is removed.

Figure 6:
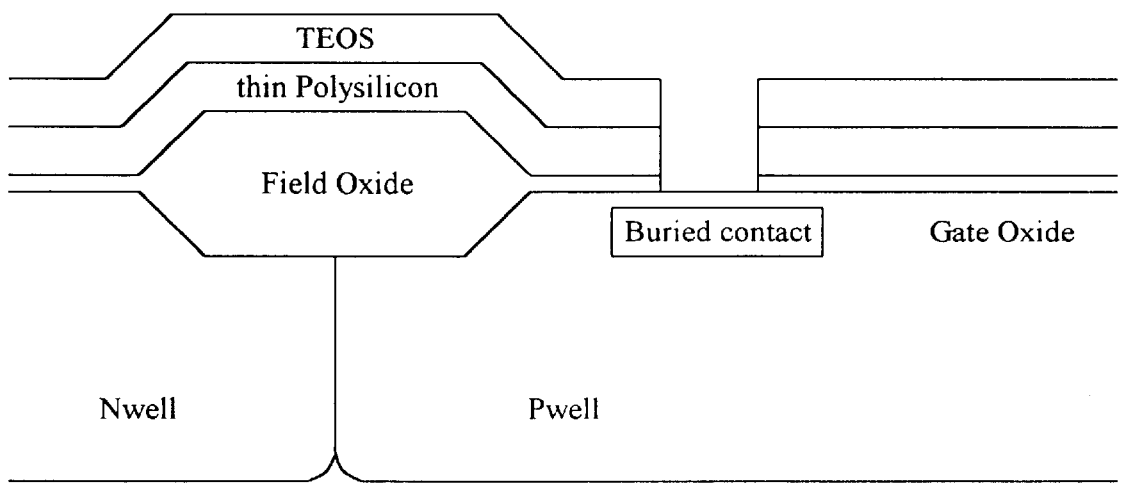

The resulting structure of the above four processes is shown in FIG. 6 and further undergoes the following processes.

Figure 7:
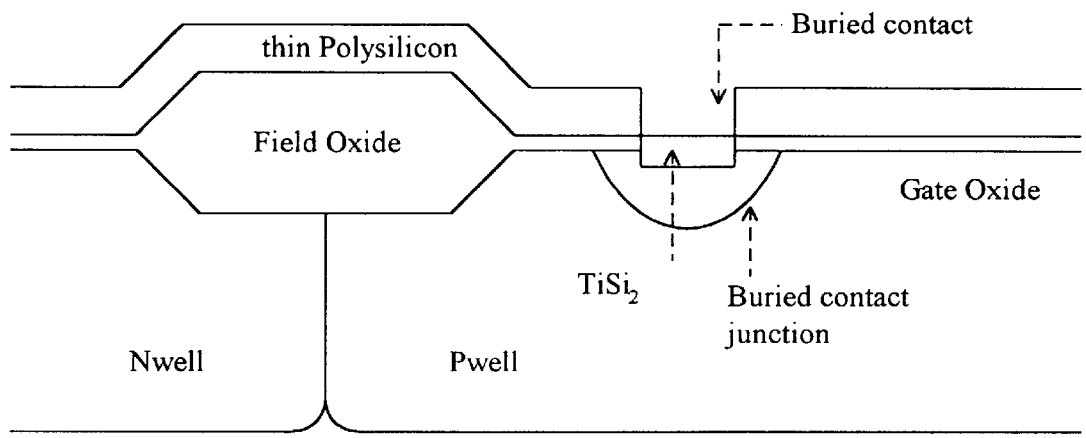

6. A salicide film is formed using Salicide technology. In particular, first, deposit titanium (500 A) and titanium nitride (500 A) on the thin polysilicon and buried contact regions. Secondly, an annealing Rapid Thermal Process in ambient nitrogen is used to form titanium silicide ($TiSi_2$) between the titanium and silicon interface as shown in FIG. 7. Thirdly, remove the titanium and titanium nitride on the TEOS $SiO_2$ layer by selective etching solution.

7. TEOS $SiO_2$ layer is removed.

The resulting structure of the above four processes is shown in FIG. 7 and further undergoes the following processes.

8. A thick polysilicon layer is then deposited.
9. Using a diffusion process, the polysilicon layer is doped with phosphorous oxychloride ($POCl_3$) to reduce its resistance.
10. A polysilicon or polycide (Tungsten silicide) gate is patterned and the unprotected area is removed by anisotropically dry etch.
11. The photoresistor is removed.

Figure 8:
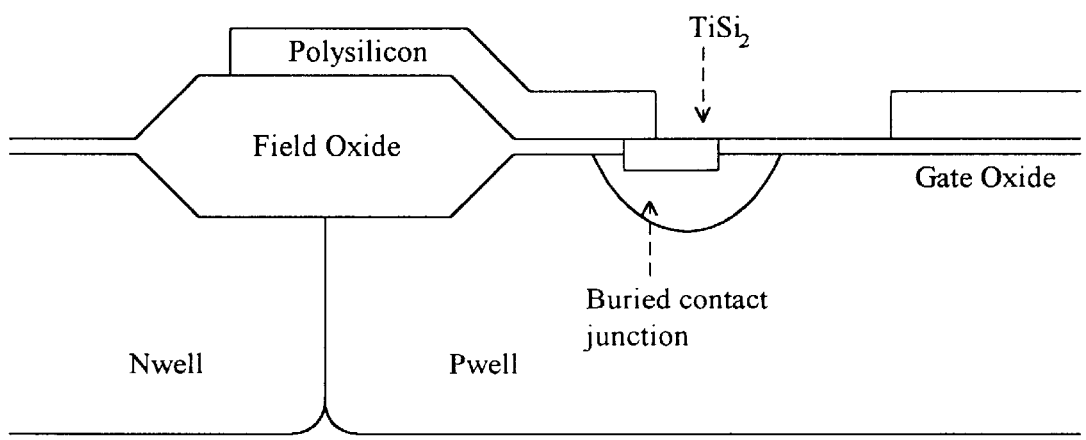

The resulting structure of the above four processes is shown in FIG. 8 and a trench within the buried contact is not found due to the titanium silicide acting as an etching stop.

Figure 9:
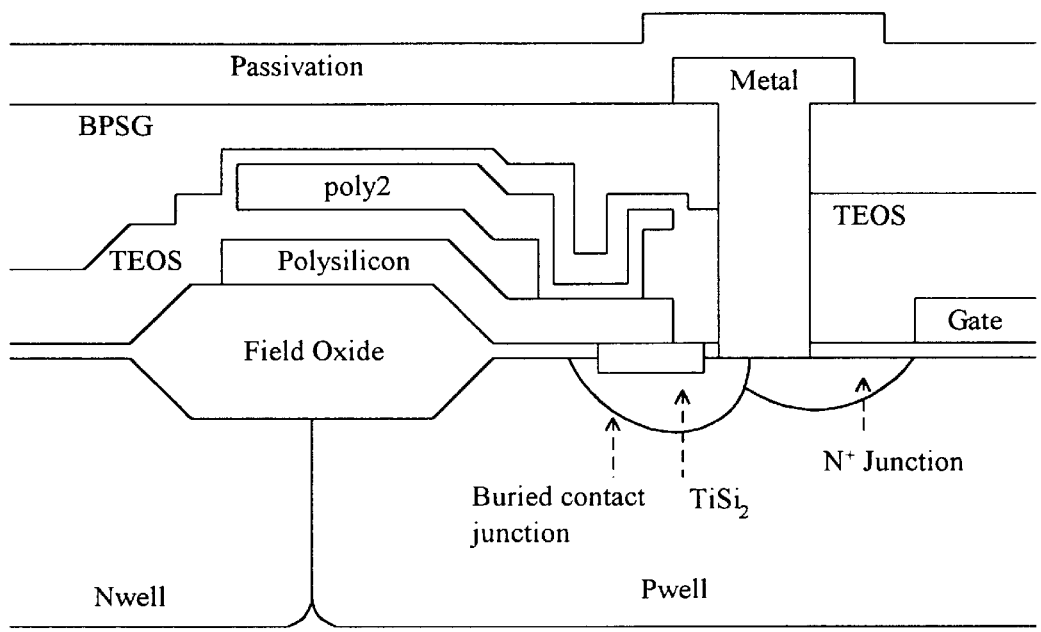

The semiconductor cell shown in FIG. 8 further undergoes the following conventional processes including forming a Source/Drain region, a TEOS (Tetra-Ethyl-Ortho-Silicate) $SiO_2$ layer, poly2, a Borophosphosilicate Glass (BPSG) dielectric layer, a contact (Tungsten plug), a metal layer and passivation layer. The final resulting structure is shown in FIG. 9.

I claim:

1. A method of manufacturing a semiconductor cell with at least one buried contact, comprising the steps of:

(1) forming a gate oxide on an active area;
   (2) forming a polysilicon layer by deposition;
   (3) forming a TEOS $SiO_2$ layer on the polysilicon layer;
   (4) establishing a protective pattern leaving unprotected the buried contact region;
   (5) anisotropically dry in-situ etching the TEOS $SiO_2$ and polysilicon layers where unprotected by a photoresist;
   (6) removing the gate oxide above the buried contact region by a wet dip process using an HF-based solution to form a window;
   (7) implanting phosphorous ions through the window to form a buried contact junction;
   (8) forming a salicide film using a salicide technology such that an etching stop is formed on the surface of the buried contact region;
   (9) removing the TEOS $SiO_2$ layer;
   (10) forming additional, layered polysilicon;
   (11) doping the additional, layered polysilicon with phosphorous oxychloride ($POCl_3$) to reduce the resistance of the additional, layered polysilicon;
   (12) establishing a protective pattern leaving unprotected a polysilicon gate area and removing the unprotected area by anisotropically dry etching.

2. The method of claim 1, wherein the etching stop is formed of titanium silicide.

3. The method of claim 1, wherein the polysilicon layer of step (2) and the TEOS $SiO_2$ layer of step (3) are each substantially 500 angstroms thick.

4. A method of manufacturing a semiconductor cell with at least one buried contact, comprising the steps of:

(1) forming a gate oxide on an active area;
   (2) forming a polysilicon layer by deposition;
   (3) forming a TEOS $SiO_2$ layer on the polysilicon layer;
   (4) establishing a protective pattern leaving unprotected the buried contact region;
   (5) etching the TEOS $SiO_2$ and polysilicon layers where unprotected by a photoresist;
   (6) removing the gate oxide above the buried contact region by a wet dip process using an HF-based solution to form a window;
   (7) implanting phosphorous ions through the window to form a buried contact junction;
   (8) forming an etching stop on the surface of the buried contact region;
   (9) removing the TEOS $SiO_2$ layer;
   (10) forming additional, layered polysilicon;
   (11) reducing the resistance of the polysilicon layer and the additional, layered polysilicon;
   (12) establishing a protective pattern leaving unprotected a polysilicon gate area; and
   (13) removing the unprotected area.

5. The method of claims 4, wherein said etching in step (5) is a dry etching.

6. The method of claim 5, wherein said dry etching is anisotropically dry in-situ etching.

7. The method of claim 4, wherein the etching stop is formed using a salicide technology.

8. The method of claim 4, wherein the resistance reduce step is performed by doping with phosphorous oxychloride ($POCl_3$).

9. The method of claim 5, wherein the removing step in step (13) is performed by dry etching.

* * * * *